United States Patent
Wendell et al.

[19]

[11] Patent Number: 5,883,826
[45] Date of Patent: Mar. 16, 1999

[54] MEMORY BLOCK SELECT USING MULTIPLE WORD LINES TO ADDRESS A SINGLE MEMORY CELL ROW

[76] Inventors: Dennis Lee Wendell, 7979 Kemper Ct., Pleasanton, Calif. 94588; John Christian Holst, 722 Live Oak Way, San Jose, Calif. 95129

[21] Appl. No.: 938,048

[22] Filed: Sep. 26, 1997

Related U.S. Application Data

[60] Provisional application No. 60/027,379 Sep. 30, 1996.

[51] Int. Cl.$^6$ .................................................... G11C 5/06
[52] U.S. Cl. ........................ 365/63; 365/51; 365/230.03
[58] Field of Search ...................... 365/63, 51, 230.03, 365/230.06, 185.11, 185.13, 49

[56] References Cited

U.S. PATENT DOCUMENTS

| | | | |
|---|---|---|---|
| 4,388,705 | 6/1983 | Sheppard | 365/210 |
| 4,990,999 | 2/1991 | Oishi et al. | 357/71 |
| 5,172,335 | 12/1992 | Sasaki et al. | 365/63 |
| 5,263,002 | 11/1993 | Suzuki et al. | 365/63 |
| 5,379,247 | 1/1995 | Kuriyama et al. | 365/63 |
| 5,432,730 | 7/1995 | Shubat et al. | 365/63 |
| 5,563,826 | 10/1996 | Pascucci et al. | 365/185.21 |
| 5,642,308 | 6/1997 | Yoshida | 365/185.12 |
| 5,708,620 | 1/1998 | Jeong | 365/63 |

*Primary Examiner*—Son T. Dinh
*Attorney, Agent, or Firm*—Skjerven, Morrill, MacPherson, Franklin & Friel LLP; Ken J. Koestner

[57] ABSTRACT

A highly suitable power conservation technique involves extending multiple word lines over a memory array row and connecting a portion of the memory cells of the memory array row to each of the word lines. Power is supplied only to the portion of the memory cells that is accessed, eliminating the static power consumption of the non-accessed memory cells. By connecting multiple word lines to select a portion of a memory row, a column address of the memory is mapped into a row decode space. Multiple metal layers in a complex integrated circuit may be exploited to form cache block select lines using multiple word lines per cell row. A storage includes a plurality of storage cells arranged in an array of rows and columns, a plurality of bit lines connecting the array of storage cells into columns, and a plurality of word lines connecting the array of storage cells into rows. The plurality of word lines include multiple word lines for a single row of the plurality of rows so that multiple portions of the storage cells in the single row are addressed by corresponding multiple word lines.

33 Claims, 9 Drawing Sheets

MEMORY BLOCK SELECT USING MULTIPLE WORD LINES TO ADDRESS A SINGLE MEMORY CELL ROW

CROSS-REFERENCE TO RELATED APPLICATION

This application claims the benefit under 35 U.S.C. § 119(e) of U.S. Provisional Application Ser. No. 60/027,329, filed Sep. 30, 1996, entitled "An X86 Microprocessor with Multi-Media Extensions" and naming Donald A. Draper, Matthew P. Crowley, John Holst, John G. Favor, Amos Ben-Meir, Jeffery E. Trull, Raj Khanna, Dennis Wendell, Ravikrishna Cherukuri, Joe Nolan, Hamid Partovi, Mark Johnson, and Tom Lee as inventors, which provisional application discloses an exemplary embodiment of the present invention and which is incorporated herein by reference in its entirety.

BACKGROUND OF THE INVENTION

1. Field of the Invention

The present invention relates to memory architectures for usage in circuits including microprocessors. More specifically, the invention relates to memory addressing circuit and memory addressing technique for accessing memory cells.

2. Description of the Related Art

Microprocessor architectures are continually evolving to improve and extend the capabilities of personal computers. Execution speed, power consumption, and circuit size are aspects of microprocessors and microprocessor performance that are constantly addressed by processor architects and designers in the ongoing quest for an improved product. Execution speed not only depends on the clock rate of a processor, but also upon the speed of interfaces such as cache memories and buses that supply instructions and data for execution by a processor core.

The reduction or minimization of power consumption is a highly desirable design objective for the integrated circuits in a microprocessor. Microprocessors are typically designed for usage in portable applications in which power consumption is strictly limited to a selected power envelope. In such applications, nearly every circuit is scrutinized to achieve as low a power consumption as is possible. Even in nonportable applications, conservation of power is a paramount design consideration.

What is needed is a memory addressing circuit and technique for accessing memory that reduces power consumption, decreases the physical size of memory for a given memory capacity, and improves memory access time.

SUMMARY

A highly suitable power conservation technique involves extending multiple word lines over a memory array row and connecting a portion of the memory cells of the memory array row to each of the word lines. Power is only dissipated in memory cells that are active. Information in the column select designates which memory cells are to be accessed. Only those memory cells that are to be accessed are activated, dissipating less power.

By connecting multiple word lines to select a portion of a memory row, a column address of the memory is mapped into a row decode space.

It has been discovered that multiple metal layers in a complex integrated circuit may be exploited to form cache block select lines using multiple word lines per cell row.

In accordance with an embodiment of the present invention, a storage includes a plurality of storage cells arranged in an array of rows and columns, a plurality of bit lines connecting the array of storage cells into columns, and a plurality of word lines connecting the array of storage cells into rows. The plurality of word lines include multiple word lines for a single row of the plurality of rows so that multiple portions of the storage cells in the single row are addressed by corresponding multiple word lines.

In accordance with another embodiment of the present invention, a processor includes an execution engine, an instruction decoder connected to the execution engine, and a storage connected to the instruction decoder. The instruction decoder decodes instructions and supplies operations to the execution engine for execution. The storage supplies instructions to the instruction decoder and includes a plurality of storage cells arranged in an array of rows and columns, a plurality of bit lines connecting the array of storage cells into columns, and a plurality of word lines connecting the array of storage cells into rows. The plurality of word lines include multiple word lines for a single row of the plurality of rows so that multiple portions of the storage cells in the single row are addressed by corresponding multiple word lines.

In accordance with another embodiment of the present invention, a method of accessing information in a storage includes arranging a plurality of storage cells in an array of rows and columns with the storage cells being connected into columns by a plurality of bit lines and connected into rows by a plurality of word lines, separating a single row of the plurality of rows into multiple portions of the storage cells, connecting multiple word lines to corresponding multiple portions of the storage cells in the single row, and addressing the multiple portions of the storage cells in the single row by the corresponding multiple word lines.

Many advantages are achieved by the described system and operating method. It is advantageous that the described system and operating method achieve a substantial conservation of operating power. Another advantage is a substantially reduced load on a word line. Since only a portion of the memory cells in a row load the word line, the delay on the word line is advantageously reduced. Furthermore, column multiplexing achieves a net operating speed improvement and a net power improvement.

BRIEF DESCRIPTION OF THE DRAWINGS

The features of the described embodiments believed to be novel are specifically set forth in the appended claims. However, embodiments of the invention relating to both structure and method of operation, may best be understood by referring to the following description and accompanying drawings.

DETAILED DESCRIPTION OF THE ILLUSTRATIVE EMBODIMENTS

Figure 1:
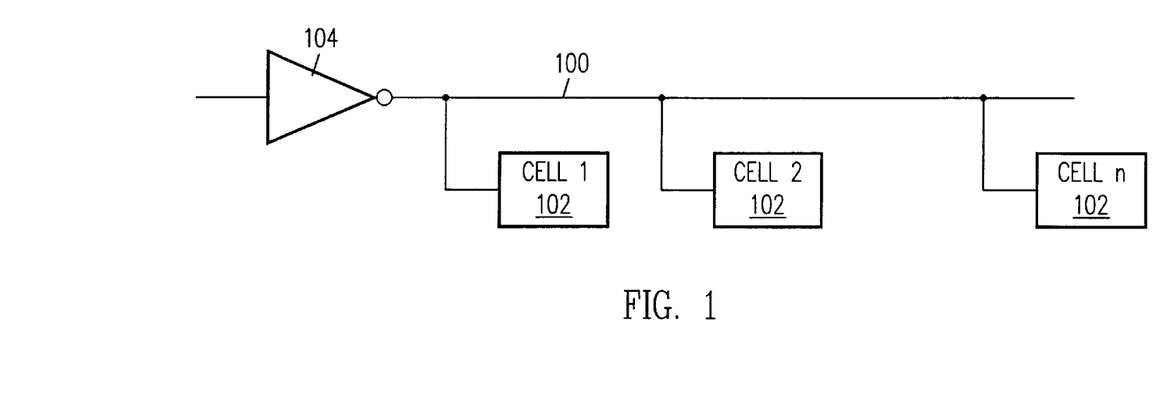
FIG. 1 is a schematic block diagram illustrating an embodiment of a word line for usage in a storage such as a cache memory.

Referring to FIG. 1, a schematic block diagram illustrates an embodiment of a word line 100 for usage in a storage such as a cache memory. A word line is a line in the row direction within a memory cell array of a random access memory (RAM) or a read-only memory (ROM) which activates the access of transistors of one memory row or page. The word line is usually connected to the gate of the access transistors. A bit line is a line in the column direction of a memory cell array in RAM or ROM to which the stored value of a selected memory cell is transferred. The bit line is usually connected to the selection transistor.

The cache memory is typically a static random access memory (RAM) array, although a similar structure may be implemented for other memory types such as dynamic random access memory (DRAM). The word line 100 selects a row memory cells 102 for read or write access within a memory. The word line 100 includes a row decoder 104 which is illustratively shown as a simple inverter. The word line 100 has a plurality (n) of memory cells 102 connected to the word line 100. The row decoder 104 drives the word line 100 to control read and write accesses of the memory cells 102. The memory cells 102 are depicted as CMOS six-transistor (6T) memory cells. In other embodiments, other types of memory cells such as four-transistor (4T) cells may be used.

In a memory read operation, although selection of a word line 100 controls all n memory cells 102 of an n-cell word line, typically not all n data bits are read from the memory.

Figure 2:
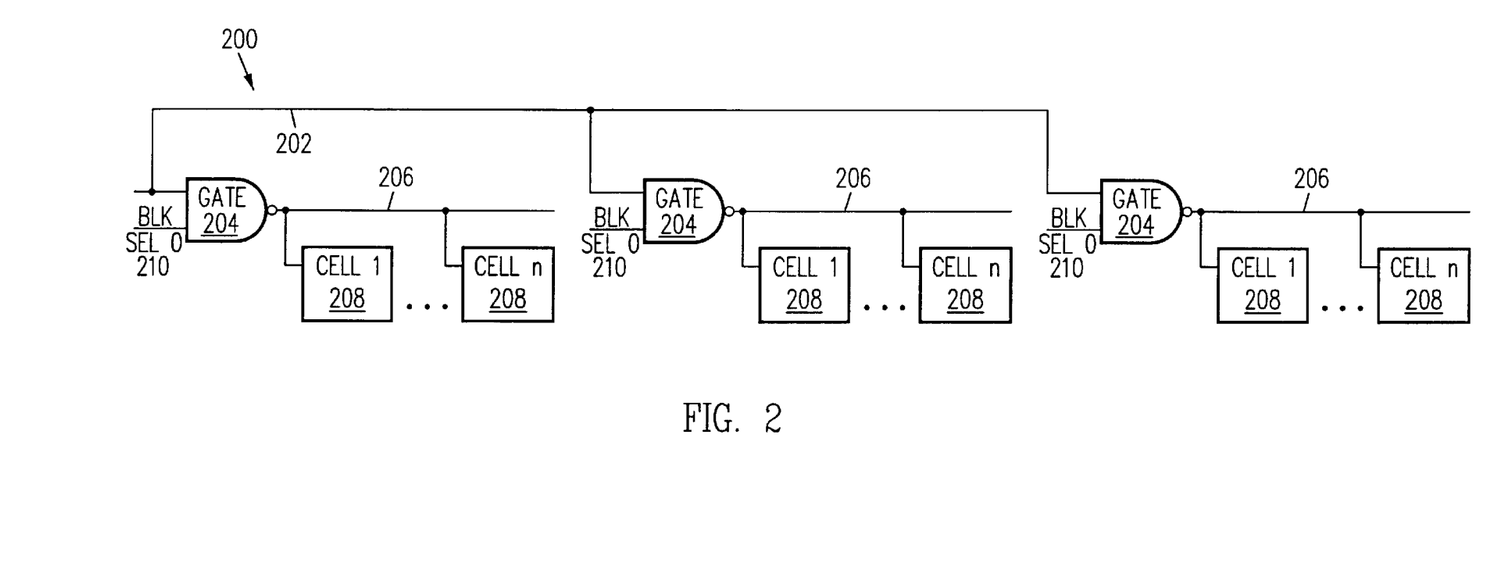
FIG. 2 is a schematic circuit diagram illustrating a portion of a memory which uses a block decoding technique utilizing logic gates for selecting a particular block of memory.

Referring to FIG. 2, a schematic circuit diagram illustrates a portion of a memory 200 using a block decoding technique utilizing logic gates for selecting a particular block of memory. In the illustrative embodiment, a word line 202 is connected to a plurality of logic gates 204 to select a corresponding plurality of memory blocks. The individual logic gates 204, shown as NAND gates, select a local word lines 206 that are connected to a plurality of memory cells 208. A plurality of block select signal lines 210, for example block select 0, block select 1, and so on to block select n, are connected to the individual logic gates 204 for selecting the local a word lines 206.

Several disadvantages arise from the usage of logic gates to select active blocks in the memory 200. One disadvantage is the large size of logic gates, a characteristic that opposes the evolution and development of ever-miniaturized circuits. The usage of large size of logic gates in an array of memory cells is further disadvantageous because of the relatively small size of memory cells. Fabrication of structures having substantially different sizes in the same pitch is very difficult. A suitable geometrical arrangement of logic gates and memory cells is difficult to achieve. A further disadvantage of a memory select structure combining logic gates and memory cells is the gate delay that is inherent in logic gates. The gate delays disadvantageously reduce the operating speed of the memory. The gate delays also disadvantageously impede timing consistency in the memory array. Usage of delay elements to restore timing consistency slows memory operations and increases the size of the memory circuit. Furthermore, the high I/O bandwidth of a cache disadvantageously results in more block select logic gates.

Figure 3:
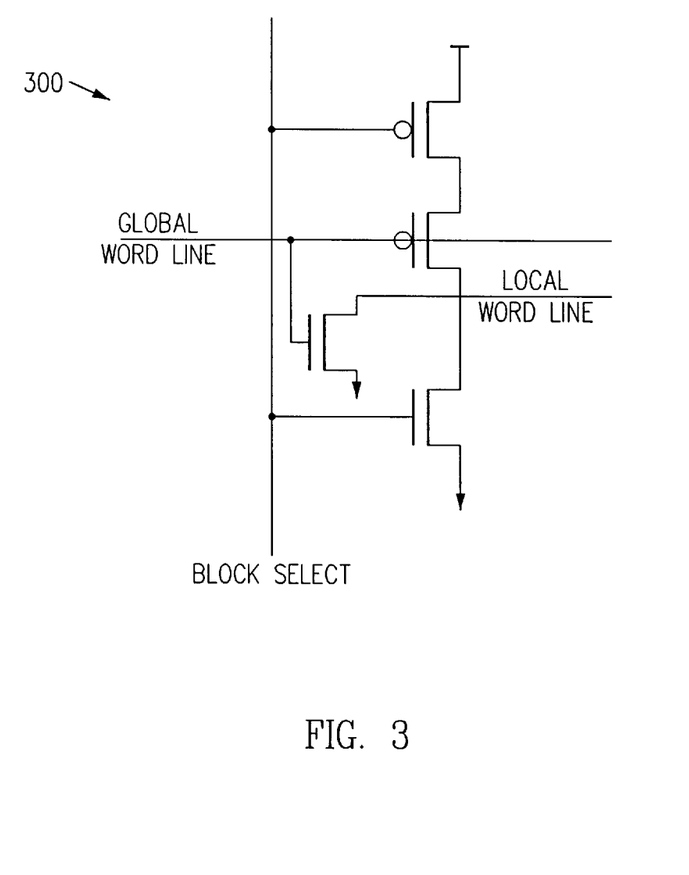
FIG. 3 is a schematic circuit diagram showing an embodiment of a simple logic gate for usage in block selection in a memory implementing a block decoding technique using logic gates.

Referring to FIG. 3 in combination with FIG. 2, a schematic circuit diagram shows an embodiment of a simple logic gate 300 for usage in block selection in a memory implementing a block decoding technique using logic gates. For example in a 0.35 micron technology, the logic gate 300 has a width of approximately 6.65 microns in comparison to a typical memory cell size of approximately 4 microns. Furthermore, one logic gate 300 with a width of approximately 6.65 microns is included for each selectable block in the memory so that a 32 block memory would include 32 logic gates 300, consuming a total area of 212.8 microns. In contrast, the illustrative technique of implementing a memory block select using multiple word lines per cell row does not include logic gates but instead utilizes a physical gap for a spacer cell (shown in FIG. 7) having a typical size of 2.2 microns. A single physical gap is shared between two blocks so that a 32 block memory has 18 spacer cells, consuming a total area of 39.6 microns, less than 20% of the area consumed using logic gates.

An additional disadvantage of a memory select structure combining logic gates and memory cells is the small granularity of some memory structures, such as cache memories. A cache typically has a wide input/output (I/O) complexity which would be typically addressed through the usage of many block select control lines, an impractical solution due to an increased area penalty. Some caches have up to half as many output lines as columns of memory cells so that only a small number of bits, for example four, eight or at most 16 bits are driven by a local word line. In contrast, a typical static RAM has one output line that is driven from a large number of bits, for example 64 bits. Due to this small granularity, a cache with block select typically includes a large number of block select logic gates, consuming a large circuit area within in array of memory cell transistors and slowing the memory access speed.

Figure 4:
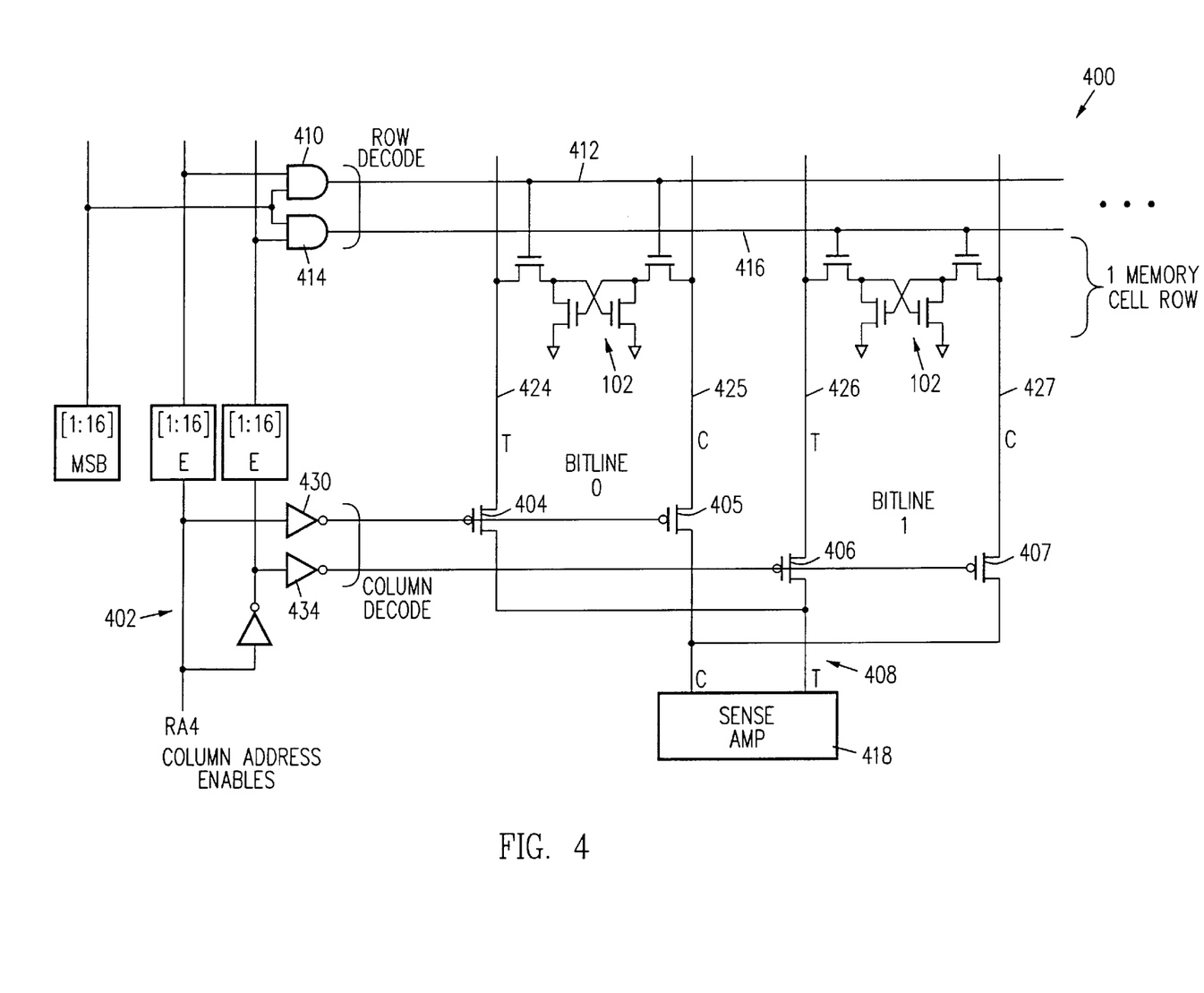
FIG. 4 is a highly schematic circuit diagram illustrating a novel approach for reduction of power uses pairs of row decoders per memory cell pitch decoded by the least significant column decode bit.

Referring to FIG. 4, a highly schematic circuit diagram illustrates a novel approach for reduction of power uses pairs of row decoders per memory cell pitch decoded by the least significant column decode bit. A memory 400 includes a column multiplexer 402 implementing a cache block select using multiple word lines in a memory cell row. The illustrative column multiplexer 402 is a 2:1 column multiplexer, although other multiplexing factors such as 4:1, 8:1, and 16:1 may be implemented in other embodiments. Typically the multiplexing factor is $2^n$ for an exponent n that is suitable for usage in an integrated circuit. The 2:1 column multiplexer 402 includes four P-channel metal-oxide-semiconductor (MOS) transistors 404, 405, 406, and 407 that are connected at a data output terminal 408, each having a source-drain pathway between a respective memory column and the data output terminal 408. P-channel MOSFET 404 is connected to a true bit line 424 of a <0> bit-line pair. P-channel MOSFET 405 is connected to a complement bit line 425 of a <0> bit-line pair. P-channel MOSFET 406 is connected to a true bit line 426 of a <1> bit-line pair. P-channel MOSFET 407 is connected to a complement bit line 427 of a <1> bit-line pair.

The memory 400 includes a pair of row decoders 410 and 414 driving respective word lines 412 and 416 in a single memory cell pitch. The pair of row decoders 410 and 414 respectively and selectively activate memory cells 102 based on row address information. The memory 400 also includes a pair of column decoders 430 and 434 to selectively drive differential column select control signals including bit <0> true and complement select signals for bit <0> true line 424 and bit <0> complement line 425. Using column decoder 430, PMOS transistor 404 controls the bit <0> true line 424 and PMOS transistor 405 controls the bit <0> complement line 425. Using column decoder 434, PMOS transistor 406 controls the bit <1> true line 426 and PMOS transistor 407 controls the bit <1> complement line 427. Through usage of column multiplexing, fewer than all the bits in a row of memory cells 102 are accessed when a word line is actuated. For example, during a read operation the usage of column multiplexing permits a read-out of fewer than all the bits in a row of memory cells 102.

Figure 9:
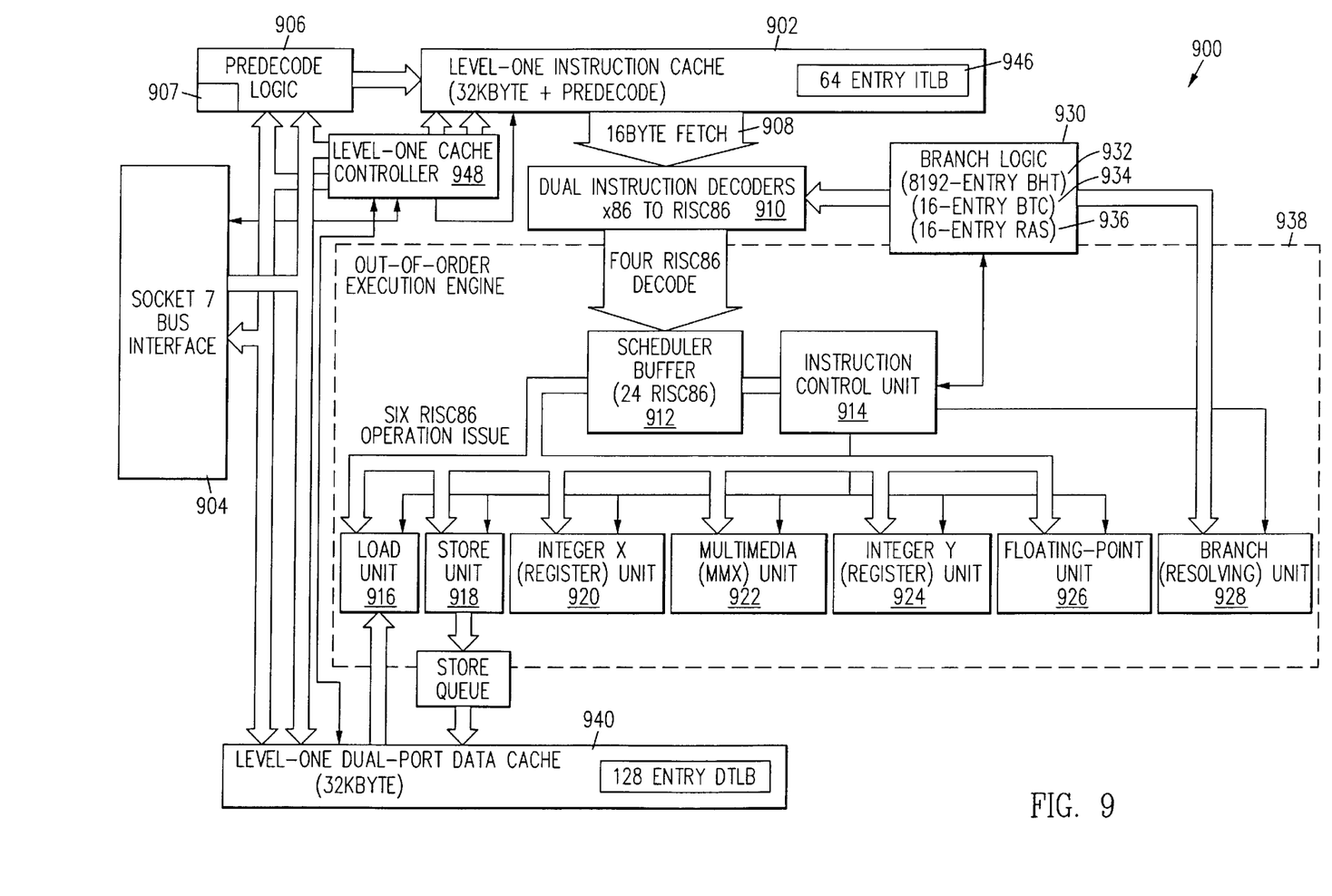
FIG. 9 is an architectural block diagram which illustrates an embodiment of a microprocessor in accordance with an embodiment of the present invention.

The level-one cache controller 948 shown in FIG. 9 supplies a column address for addressing the memory cells 102. The column address determines the word line signals for controlling the column multiplexer 402 and determines the memory cells 102 that are potentially accessed. The operation of multiplexing the block select lines of the memory 400 permits accessing of a portion of the memory cells 102 while another portion of the memory cells 102 is specifically not accessed. The memory 400 exploits the known condition of memory cells 102 to purposely decline to activate the access transistors that are not accessed by the column decode, thus denying the supply of operating power to the non-accessed memory cells 102. Several advantages are gained by accessing only the bits designated by the column decode reference. A first advantage is a significant conservation of power, particularly for a wide memory such as the L1 instruction cache 902 and the data cache 940. A second advantage is a substantial reduction of the load on a word line. Third, since only a portion of the memory cells 102 on a word line load the word line, the delay on the word line is reduced, although some reduction in delay is not realized since an additional input bit is applied for decoding the word line and differentiating between the two column lines, typically the even line and the odd line. Generally, block decoding achieves a small net operating speed improvement and a net power improvement.

Figure 5:
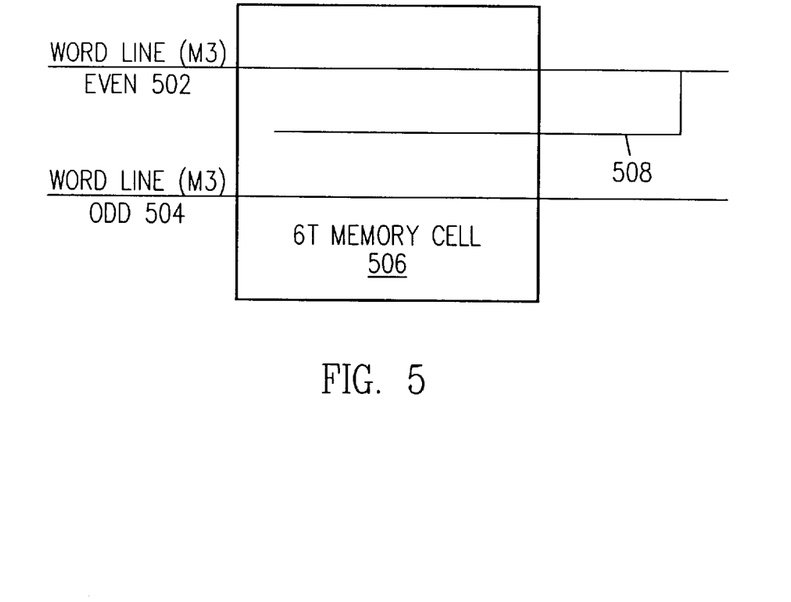
FIG. 5 is a schematic block diagram illustrating a region of a memory implementing a memory block select using multiple word lines per cell row.

Referring to FIG. 5, a schematic block diagram illustrates a region of a memory 500 implementing a memory block select using multiple word lines 502 and 504 per cell row. Multiple metal layers in a complex integrated circuit are exploited to form cache block select lines using multiple word lines per cell row. The multiple metal layers run physically over an array of memory cells. Two metal word lines including a column select even 502 and a column select odd 504 are selectively connected to a single polysilicon word line 508 supply addressing to a memory cell 506.

Figure 6:
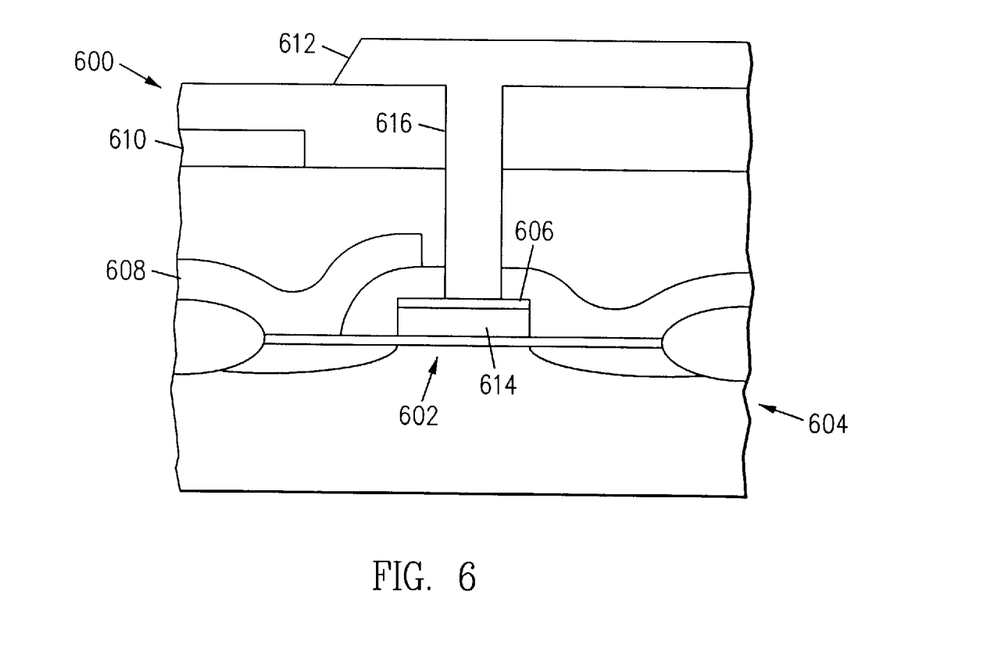
FIG. 6 is a cross-sectional view showing an integrated circuit including a transistor in a memory cell.

Referring to FIG. 6, a conceptual cross-section view shows an integrated circuit 600 including a transistor 602 in a memory cell 604. The integrated circuit 600 has a polysilicon word line 606 and a plurality of metal layers including a metal layer 1 608, a metal layer 2 610, and a metal layer 3 612. In the illustrative embodiment, metal layer 3 612 is used to supply control signals to a gate electrode 614 of the transistor 602. In other embodiments, other metal layers may be used to control the transistors of a memory cell including additional metal layers such as a metal 4 layer, a metal 5 layer and so on. A memory cell 604 is typically sufficiently tall that a metal word line 616 is formed overlying the memory cell 604 and extended down through intervening layers to contact a polysilicon word line 606 that forms the gate electrode 614. The extension of the metal layer 3 612 serves the function of a logic gate such as the NAND logic gate 204, but advantageously performs this function in a very narrow pitch. Advantageously, the formation of logic gates within the memory array is avoided.

Figure 7:
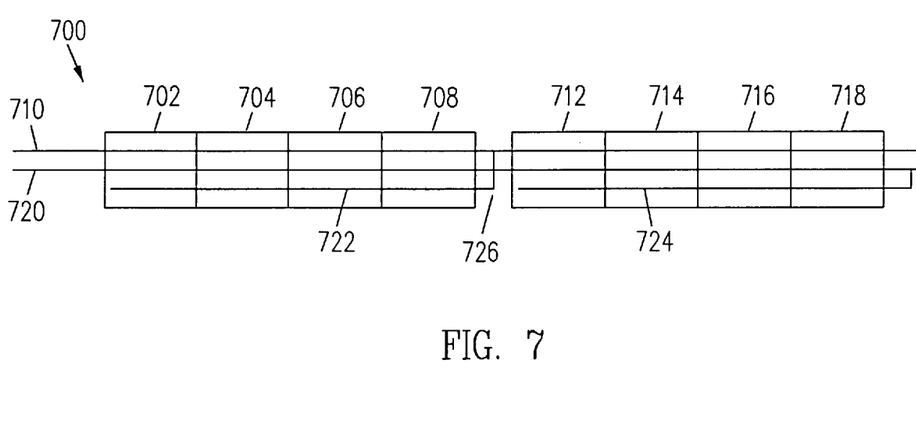
FIG. 7 is a schematic pictorial view of a segment of a memory array showing eight memory cells including four even column select memory cells and four odd column select memory cells.

Referring to FIG. 7, a schematic pictorial view of a segment of a memory array 700 shows eight memory cells including four even column select memory cells 702, 704, 706, and 708, and four odd column select memory cells 712, 714, 716, and 718. The even column select memory cells 702, 704, 706, and 708 are connected to an even metal word line 710 (binary 0 of column select bit <1>) and the odd column select memory cells 712, 714, 716, and 718 (binary 1 of column select bit <1>) are connected to an odd metal word line 720. The illustrative view of the memory array 700 shows an embodiment of a structure for connecting the metal word lines 710 and 720 to polysilicon word lines 722 and 724, respectively for the even column select memory cells 702, 704, 706, and 708 and the odd column select memory cells 712, 714, 716, and 718. The metal word lines 710 and 720 are connected to polysilicon word lines 722 and 724 at a spacer cell 726 or gap cell between the four even column select memory cells 702, 704, 706, and 708 and the four odd column select memory cells 712, 714, 716, and 718. Usage of the spacer cell 726 to connect polysilicon and metal word lines for block decoding does not increase the size of memory since the spacer cell 726 is an existing structure that is newly exploited for the block decoding function. Conventionally, the spacer cell 726 is used to form vertical connections of power supply nodes, substrate and well ties, floating gate tie-downs. Conventionally, the spacer cell 726 is further used to accommodate polysilicon diodes for advanced processing, substrate contacts that are not present in the memory cell layout, and generation of a two-dimensional VSS/VDD grid.

In some embodiments, a physical gap for the spacer cell 726 may have a varying size, depending on the structure of the memory cells. In some embodiments, the physical gap may be virtually nonexistent.

In the illustrative embodiment, the four even column select memory cells 702, 704, 706, and 708 are programmed to the even metal word line 710 of a metal 3 layer. The four odd column select memory cells 712, 714, 716, and 718 are programmed to the odd metal word line 720 of the metal 3 layer. When the even metal word line 710 is activated, the four memory cells 702, 704, 706, and 708 are accessed, which are connected to the even input terminal of the column multiplexer 402 shown in FIG. 4. The level-one cache controller 948 shown in FIG. 9 to activate the access transistors of the four bit <0> memory cells 702, 704, 706, and 708 while withholding activation to the access transistors of the four bit <1> memory cells 712, 714, 716, and 718 so that no power is dissipated in the bit <0> column cells.

Using the illustrative memory architecture, the level-one cache controller 948 determines how to access and supply power to the memory cells according to what information is sought from the memory. For example, instructions may be accessed from the first word line 710, accessed from the second word line 720, or accessed from both word lines 710 and 720. The level-one cache controller 948, depending on the information to be accessed, supplies power to the first word line 710, the second word line 720, or both word lines 710 and 720. Since a single word line is typically active, nearly a 50% power reduction is realized. This power reduction is achieved at a cost of decoding a bit in the column address space in combination with extra row address decoding.

The illustrative connection structure using the connection of metal word lines to polysilicon word lines supplies a block selection functionality, reduces power consumption, achieves a small net access time reduction thus increasing memory access speed, and avoiding the high overhead in powering the area of an entire memory array.

The illustrative memory array connection advantageously is suitable for forming a square or nearly square array. Memory arrays tend to operate most effectively, with best access times, in a square geometry so that RC delays are maintained within a suitable range in both the word lines and bit lines.

Figure 8:
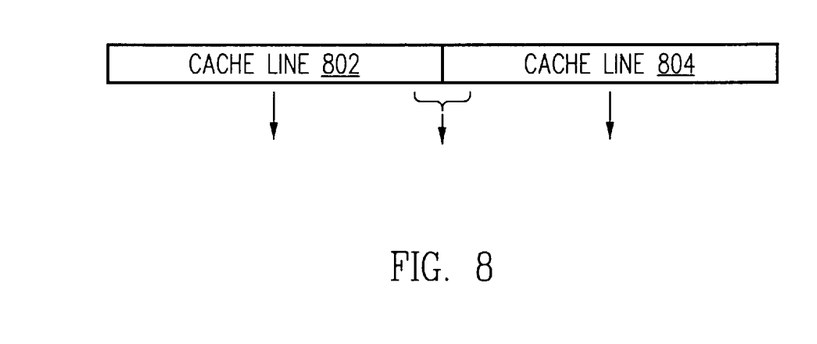
FIG. 8 is a schematic block diagram illustrating a "wrap-around" concept for accessing cache lines.

Referring to FIG. 8, a schematic block diagram illustrates a "wrap-around" concept for accessing cache lines 802 and 804. Either or both word lines 502 and 504, shown in FIG. 5, are selectively activated depending on wrap-around between an upper cache line word 802 or a lower cache line word 804. A cache line is defined as a complete data portion that is exchanged between a cache and a main memory. Typically, in a cache line a double word for a 32-bit data bus is given by address bits A3–A2. A cache line is either completely valid or completely invalid, a partially valid state is not possible. When only a single byte is to be accessed, all sixteen bytes of a cache line are stored to prevent a "cache miss" condition.

The cache block select using multiple word lines 502 and 504 per cell row is highly useful for effecting "wrap-around" between upper 802 and lower cache lines 804. Activation of the word lines 502 and 504, either individually or in combination, is controlled to physically interleave the two cache lines 802 and 804. For example, if an instruction resides only in the upper cache line 802, both beginning and ending in the upper cache line 802, then only the word line that activates the upper cache line 802 is activated. Likewise, if an instruction resides only in the lower cache line 804, both beginning and ending in the lower cache line 804, then only the word line that activates the lower cache line 804 is activated. However, if an instruction begins in the upper cache line 802 but extends into the lower cache line 804, to access the entire instruction in a single cycle both word lines are activated to read out the entire instruction. Wrap-around handling of cache lines is particularly useful for the x86 instruction set which has a variable length instruction set since instructions that overlap cache lines occur often.

Referring to FIG. 9, a schematic block diagram illustrates an embodiment of an AMD-K6 microprocessor 900. The microprocessor 900 is an X86 instruction set-compatible microprocessor implementing a set of Multi-Media eXtensions (MMX). A level-one (L1) instruction cache 902 begins predecoding instructions obtained from a processor system bus interface 904 during filling of the 32 KB two-way associative L1 instruction cache 902. The L1 instruction cache 902 includes a 64-entry instruction translational lookahead buffer (ITLB) 946. Bypass (not shown) and storage buffers (not shown) for instructions (4×16) and predecode (4×20) to the L1 instruction cache 902 are supplied to allow data-in and data flow-back to cache output terminals.

A level-one cache controller 948 controls caching in the L1 instruction cache 902. The L1 instruction cache 902 uses a Most Recently Used (MRU) prediction technique to predict the way selection on cache accesses. A misprediction in the way selection results in a penalty of one cycle. The L1 instruction cache 902 line replacement algorithm is Least Recently Used (LRU) although an alternative random replacement algorithm is supported using an SR5.ICERLR configuration bit. The L1 instruction cache 902 also supports a direct-mapped replacement algorithm, reducing the cache size from 32 KB to 16 KB, using an SR5.ICDM configuration bit.

The L1 instruction cache 902 performs a simple prefetching algorithm. When a line miss occurs, as distinguished from a sub-block miss, and the miss occurs on sub-block 0 of the line (bit[5] of the address is 0), then both sub-blocks are fetched and pipelined on the bus.

The microprocessor 900 includes predecode logic 906 and a predecode cache 907 to identify instruction boundaries and fill the L1 instruction cache 902. Once the L1 instruction cache 902 is filled, predecode bits are stored in the 20 kB predecode cache 907. Predecode bits resolved during the predecoding operation are stored in a 20 kB predecode cache 907. Predecode logic 906 includes a first stage of instruction decode logic. Data from the L1 instruction cache 902 are fetched by fetch logic 908 and transferred to dual instruction decoders 910. The dual instruction decoders 910 decodes up to two X86 instructions per clock and translates most instructions through a direct hardware decode operation into from one to four RISC-like operations, called RISC86 Ops. The hardware-decoded instructions are generally simple and common-type instructions. Other complex or uncommon instructions are mapped into ROM-resident sequences of RISC Ops using emulation code ROM translation.

Decoded instructions from the dual instruction decoders 910 are transferred to a RISC86 Op Scheduler and buffer 912. The RISC86 Op Scheduler 912 holds up to 24 RISC Ops and stores a total of 48 registers using register renaming. The Scheduler 912 contains logic to track instructions from decode to retirement, determining dependencies, scheduling execution, and committing architectural state. The Scheduler 912 is structured as a FIFO queue with instructions entering the queue four at one time to match the macroinstruction decoder bandwidth and up to four instructions retiring at one time at the end of the queue. Instructions enter the Scheduler 912 after decoding or fetching and remain in the scheduler queue until retirement. The Scheduler 912 queue is a general structure for usage for all categories of instructions and thus serves to hold instructions directed to different execution units. The Scheduler 912 utilizes implicit register renaming, which is based on position within the queue rather than explicit tag assignments, so that the Scheduler 912 avoids usage of full renaming hardware.

The Scheduler 912 manages creation and termination of operands using a hardware structure that is similar to a carry tree of a binary adder to improve speed performance, generating a carry bit for each operand while a most recent retiring or writing operation for a register terminates the carry bit. If a carry is made into a RISC86 Op and the destination of the RISC86 Op matches the operand, then that RISC86 Op is selected to supply the operand. The carry tree structure creates group generate Ggrp[7:0] and group propagate Pgrp[7:0] terms 3-RISC86 Op groups. The selection of 3-RISC86 Op groups is convenient since 24 RISC86 Ops are allocated in the Scheduler 912. The eight group terms are combined in a three-level tree to create a group carry in terms Cgrp[7:0]. The group carry terms Cgrp[7:0] are used within each group to select the operand source Op.

The RISC86 Op Scheduler 912, under control of an instruction control unit 914, issues up to six RISC86 Operations using out-of-order issuing to seven parallel execution units. The execution units speculatively execute the RISC86 Ops to generate results. The RISC86 Op Scheduler 912 retires the results in-order. The execution units include a load unit 916, a store unit 918, an integer X register unit 920, a Multi-Media extension (MMX) unit 922, an integer Y register unit 924, a floating-point unit (FPU) 926, and a branch resolving unit 928. A branch logic unit 930 implements a branch prediction operation that uses two-level branch prediction based on an 8192-entry Branch History Table (BHT) 932, a 16-entry Branch Target Cache (BTC) 934, and a 16-entry Return Address Stack (RAS) 936.

The dual instruction decoders 910 translate X86 instructions on-the-fly into corresponding RISC86 Ops. The RISC86 Ops are executed by an instruction core 938 that is essentially a RISC superscalar processing engine. The fetch logic 908 fetches up to sixteen instruction bytes each cycle from the L1 instruction cache 902 and transfers the instruction bytes into an instruction buffer (not shown) preceding the dual instruction decoders 910 so that the instruction buffer is maintained at capacity. The dual instruction decoders 910 accesses the instruction bytes from the instruction buffer, decodes up to two X86 instructions, immediately recognizes and predicts branches, and generates up to four RISC86 Ops. The RISC86 Ops are loaded into the unified RISC86 Op Scheduler 912. The RISC86 Op Scheduler 912 controls and tracks multiple aspects of RISC86 Op issue and execution.

The microprocessor 900 executes up to six operations per clock. Each cycle up to six RISC86 Ops are issued and executed in a pipelined manner. The six RISC86 Ops may include one memory read operation, one memory write operation, two integer and/or one multi-media register operation, one floating point operation, and one evaluation of a branch condition. The RISC86 Ops are executed out-of-order and are executed subject principally to actual dependencies and resource constraints. One example of a resource constraint is that a maximum of two integer register operations (RegOps) is executed per cycle. Once execution of the RISC86 Ops is complete, the RISC86 Op Scheduler 912, functioning as a reorder buffer, commits the RISC86 Ops in-order to ensure precise exception handling and full operational compatability with X86 architecture standards. The RISC86 Op Scheduler 912 performs implicit register renaming based upon position within the scheduler buffer (queue) rather than explicit tag assignments that are conventionally employed in systems that use a reorder buffer. The position-based register renaming reduces the size of renaming hardware. The RISC86 Op Scheduler 912 has a first-in-first-out (FIFO) buffer physical structure and performs implicit register renaming, characteristics which, in combination, advantageously permit the use of fast position-based instruction issue and dependency-tracking logic. The dependency-tracking logic has characteristics of many fast adder circuits in which the process of searching for a particular operand is similar to the arithmetic operation of propagating a carry through an adder.

The load unit 916 loads data via a level-one (L1) dual-port data cache 940 which receives data from an external memory (not shown) via the processor system bus interface 904. Bypass (not shown) and storage buffers (not shown) for data (4×16) to the data cache 940 are supplied to allow data-in and data flow-back to cache output terminals.

The data cache 940 includes a 128-entry data translational lookahead buffer (DTLB) 944. The data cache 940 is a 2-way set-associative, 32 KB size cache with a 64 byte line-size and 32-byte sub-blocking. The data cache 940 fills on the basis of the 32-byte sub-block units. In contrast to the L1 instruction cache 902, the data cache 940 uses a Least Recently Missed (LRM) selection technique which is generally a more accurate way selection scheme than the LRU technique of the L1 instruction cache 902. In the LRM scheme, the line that first enters the cache is replaced. An alternative random replacement algorithm is supported and activated through usage of a SR5.DCERLR configuration bit. The data cache 940 also supports a direct-mapped replacement algorithm, reducing the cache size from 32 KB to 16 KB, using an SR5.DCDM configuration bit.

The data cache 940 supports write allocation, which is disabled by setting an SR5.WAD configuration bit. Write allocation is allowed when caching is enabled through miscellaneous cache enable/disable bits and either of two conditions is true. A first condition is that a write operation hits on a line but misses on the requested sub-block. The second condition is that a write operation missed on a line but hit on a one-page cacheability control register used specifically on write-allocate operations. The cacheability control register is invalidated during RESET, translation lookahead buffer invalidations, or cache invalidations initiated by an INVD/WBINVD instruction. Snoop invalidations do not affect the cacheability control register. The cacheability control register is updated/validated on every fill with the page address of the line that was filled into the cache upon initiation by a load operation. Another cacheability control register is validated on write operations to the bus when the writes are determined to be cacheable.

The data cache 940 supports one read operation and one write operation on each cycle to either independent or dependent addresses. Stalls occur on cache misses or when a data dependency occurs that is not handled by hardware. For example, a stall takes place upon the occurrence of a read operation with a superset dependency on an older write operation that has not yet been cached. A superset dependency is defined as a read operation that requests more bytes than a write operation can supply. Address dependencies are detected by monitoring the number of requested bytes and a limited number of address bits (address bits [9:0]) due to timing constraints so that false dependencies may be detected, resulting in unnecessary stalls.

The store unit 918 transfers data to the data cache 940 through a store queue 942.

The M unit 922 is implemented to incorporate an X86 instruction subset called the Multi-Media eXtensions (thereby supporting a growing number of applications in the areas of communications and multimedia. The MMX unit 922 supports the new instructions and the new data types that are defined by the MMX standard to increase processor performance in the targeted applications. The MMX unit 922 executes a Single Instruction, Multiple Data (SIMD) technique to process multiple operands of 8, 16, or 32 bits in a 64-bit data path to perform highly parallel and computationally intensive algorithms that are typical for multimedia applications. The MMX unit 922 supports 57 new instructions that execute additions, subtractions, multiplies, multiply-accumulates, logical shifts, arithmetic shifts, and several other operations. Most operations are executed on operands of any data type.

Figure 10:
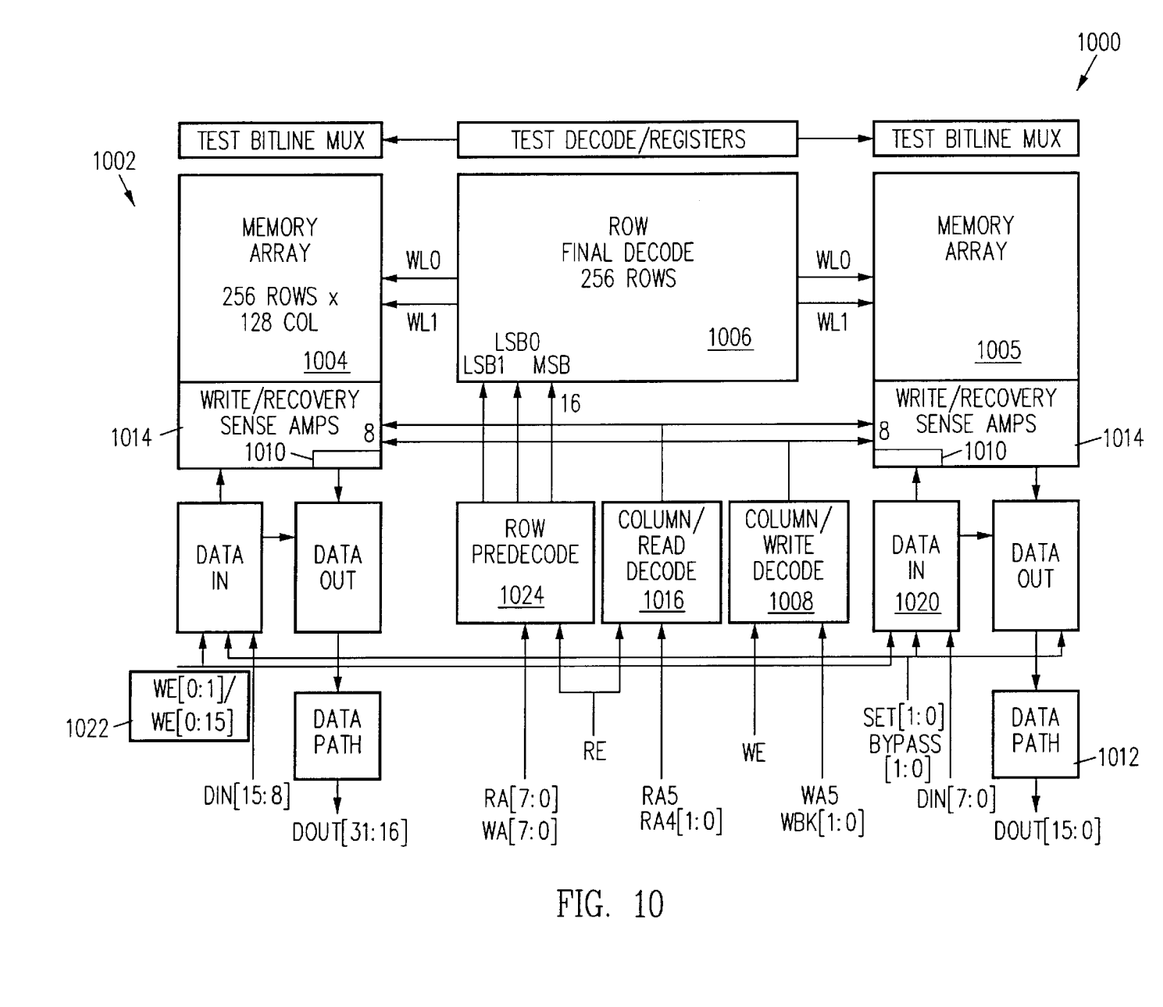
FIG. 10 is as schematic block diagram illustrating an embodiment of a cache which is suitable for usage as the data cache or the instruction cache shown in FIG. 9.

Referring to FIG. 10, a schematic block diagram shows an embodiment of a cache 1000 which is suitable for usage as the L1 instruction cache 902 or the data cache 940 shown in FIG. 9, or the predecode cache (not shown). The microprocessor 900 has several level-one (L1) caches including the 32 kB L1 instruction cache 902, the 32 kB data cache 940, and the 20 kB predecode cache 906. The L1 instruction cache 902 and the data cache 940 are 32 kB, two-way set-associative caches with a 64 byte line size, 32 byte sub-blocking, and constructed in 8 kB blocks. The predecode cache is constructed in 10 kB blocks. The L1 instruction cache 902 and data cache 940 are filled on a sub-block basis, physically-tagged, and virtually-indexed with bits 13:6, where bits 13:12 are translated address bits. Synonyms and aliasing are handled in hardware. The L1 instruction cache 902 and data cache 940 maintain mutual exclusion to simplify handling of self-modifying code. A hit-under-miss capability is supported. Each of the L1 instruction cache 902 and the data cache 940 include 256 sets. Each set contains two ways (or lines) and each line contains two sub-blocks so supply a total storage of 256×2×64B=32 kB.

FIG. 10 depicts a cache block 1002 having a size of 8 kB. The illustrative cache block 1002 includes two cache arrays 1004 and 1005, each having 256 rows and 128 columns. The cache block 1002 supports a byte write function. Row decode 1006, column write decode 1008, sense amplifier decode 1010, and datapath 1012 circuits utilize dynamic logic with keepers for delay improvement. The dynamic circuits are held static by weak keepers. While the decode 1006, 1008, and 1010 and datapath 1012 circuits are dynamic logic, data input circuits 1020, bypass circuits (not shown), and storage buffers (not shown) are circuits constructed using conventional-type CMOS logic.

A write eviction buffer 1022 has conventional-type memory cells to efficiently implement 4×256 storage locations using CMOS logic. Asynchronous input control signals are connected to the write eviction buffer 1022 to access the four storage levels. Predecode expansion logic 1024 is implemented in dual-rail, dynamic, non-clocked logic.

The cache block 1002 uses time multiplexing to perform one read operation and one write operation per clock cycle using a read column select and column read decode 1016 that are separate from a write column select and column write decode 1008.

Predecode expansion logic (not shown) is implemented in dual-rail dynamic non-clocked logic. A scan functionality is implemented in sense amplifiers 1014 to supply array bit-mapping and datapath logic testability. Testability is further enhanced by usage of separate array and word line power supplies (not shown) so that that retention is tested at the time of wafer sort in a manufacturing process to determine functionality of p-channel pull-up transistors (not shown) in the memory cells. Dual word-lines (not shown) are used in each row in combination with a one-of-two block select to reduce power consumption.

The row decode 1006 drives word lines wl to the two cache arrays 1004 and 1005 for both read and write operations. The row decode 1006 includes flip-flops (not shown) and multiplexing (not shown) for write addresses and read addresses that is located after the flip-flops. The row decode 1006 includes pairs of row decoders per memory cell pitch and decoded by the least significant column decode bit so that either or both word lines are selectively activated dependent on wrap-around between upper or lower cache line words. The paired word line structure advantageously reduces power consumption.

The L1 instruction cache 902 and the data cache 940 have physical tags, handle synonyms and aliasing in hardware, support hit under miss, and maintain mutual exclusion to assist the handling of self-modifying code.

Figure 11:
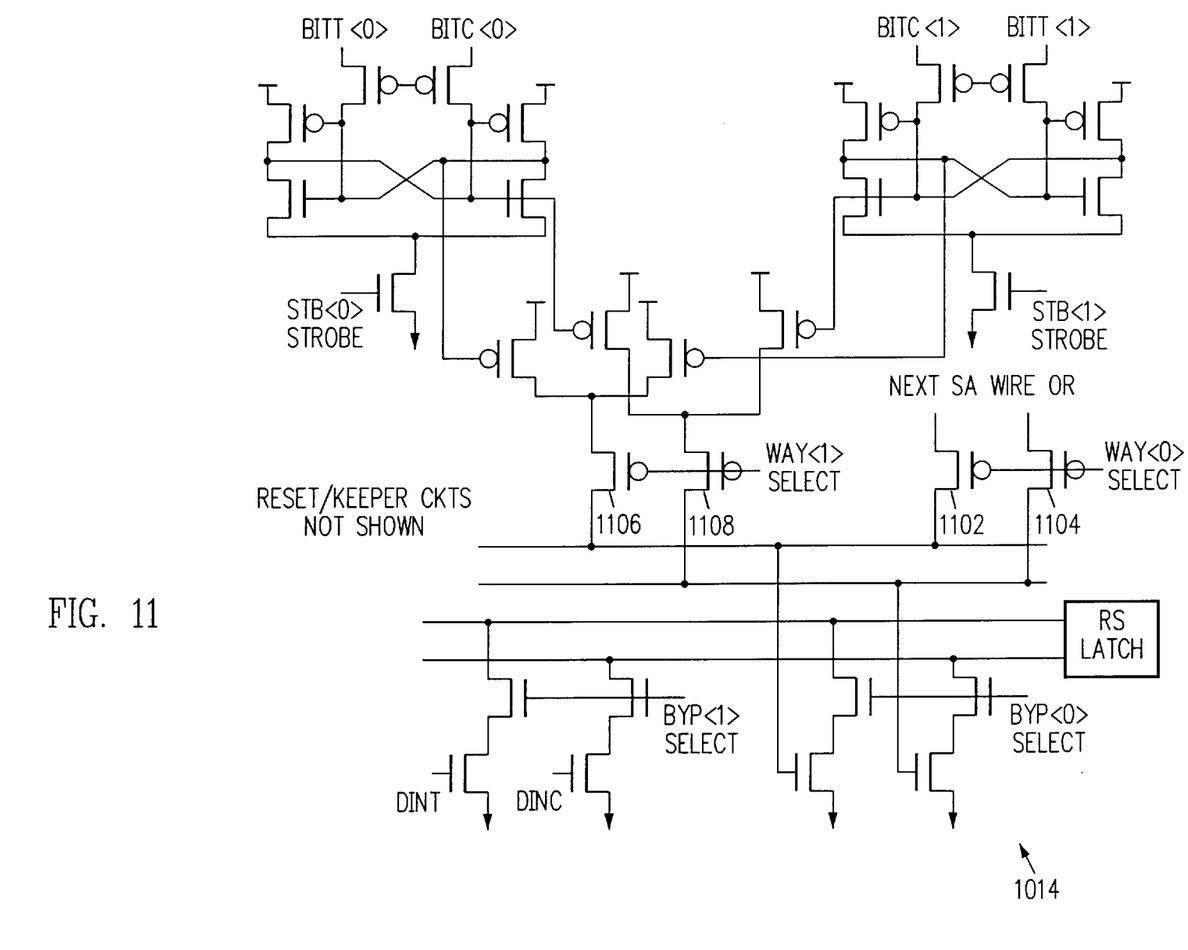
FIG. 11 is a schematic circuit diagram that illustrates an embodiment of the sense amplifiers 1014 shown in FIG. 10.

Referring to FIG. 11, a schematic circuit diagram illustrates an embodiment of the sense amplifiers 1014 shown in FIG. 10. The sense amplifiers 1014 utilize a one per column pitch regenerative sense amplifier architecture that permits late selection by the column decode and way select after cache sensing is toleranced for offsets. Sense amplifier select signals are decoded and the decoded signals are wire-ORed for column selection by transistors 1102 and 1104 for way <0> and by transistors 1106 and 1108 for way <1>. Bypass select signals are applied for controlling the sense amplifier 1014. The way select and bypass select signals are applied to the sense amplifier 1014 in a two-level cascade of two input multiplexers 1110 and 1112. The wire-OR transistors 1102, 1104, 1106, and 1108, the two input multiplexers 1110 and 1112, and an output driver 1114 are dynamic logic circuits to improve delay performance. Drivers (not shown) that increase the signal gain to a wide set (64×) of two-input way select multiplexers are also dynamic logic circuits.

A scan of the sense amplifiers 1014 supports readout of data in the cache arrays 1004 and 1005 for bitmap and debug analysis.

Figure 12:
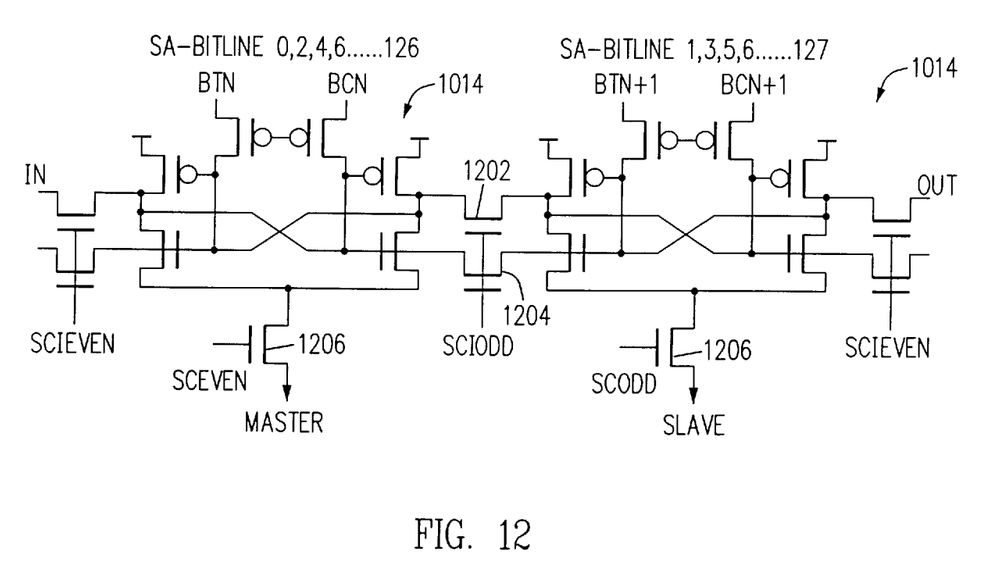
FIG. 12 is a schematic circuit diagram showing an interconnection between sense amplifiers.

Referring to FIG. 12, a simplified schematic circuit diagram shows an interconnection between sense amplifiers 1014, indicating pairing of the sense amplifiers 1014 in master/slave combinations. A pair of NMOS transfer gates 1202 and 1204 are added to column-pitched circuits between adjacent sense amplifiers 1014. Auxiliary control circuits (not shown) activate sense amplifier strobes 1206 in odd-even combinations to serially shift data through the chain of connected sense amplifiers 1014. The NMOS transfer gates 1202 and 1204 are also alternately activated by transistors (not shown) controlled using two-phase scan clocking. A first two-phase scan clock positive transition recirculates input flip-flop data from a previous read operation accessing the memory array from a last address.

While the invention has been described with reference to various embodiments, it will be understood that these embodiments are illustrative and that the scope of the invention is not limited to them. Many variations, modifications, additions and improvements of the embodiments described are possible. For example, those skilled in the art will readily implement the steps necessary to provide the structures and methods disclosed herein, and will understand that the process parameters, materials, and dimensions are given by way of example only and can be varied to achieve the desired structure as well as modifications which are within the scope of the invention. Variations and modifications of the embodiments disclosed herein may be made based on the description set forth herein, without departing from the scope and spirit of the invention as set forth in the following claims.

What is claimed is:

1. A storage comprising:

a plurality of storage cells arranged in an array of rows and columns;

a plurality of bit lines coupling the array of storage cells into columns;

a plurality of word lines crossing the array of storage cells into rows, the plurality of word lines including multiple word lines for a single row of the plurality of rows so that multiple portions of the storage cells in the single row are addressed by corresponding multiple unique word lines wherein the word lines include:

a single polysilicon word line coupled to a row of storage cells, the single polysilicon word line being broken to separate the storage cells into a first segment and a second segment;

a pair of metal layer word lines including a first metal layer word line coupled to the polysilicon word line of the first storage cell segment and a second metal layer word line coupled to the polysilicon word line of the second storage cell segment.

2. A storage according to claim 1, wherein a storage cell of the plurality of storage cells is a six-transistor (6T) storage cell.

3. A storage according to claim 1, wherein a storage cell of the plurality of storage cells is a four-transistor (4T) storage cell.

4. A storage according to claim 1, wherein the plurality of storage cells are a plurality of static random access memory (SRAM) cells.

5. A storage according to claim 1, wherein the plurality of storage cells are a plurality of dynamic random access memory (DRAM) cells.

6. A storage according to claim 1, wherein the storage is a cache memory.

7. A storage according to claim 1, further comprising:

a plurality of row decoders, individual row decoders being coupled to individual word lines of the plurality of word lines.

8. A storage according to claim 1, further comprising:

a column multiplexer coupled to the multiple word lines of the single row of storage cells.

9. A storage according to claim 1, further comprising:

a plurality of word lines crossing the array of storage cells into rows, the plurality of word lines including a plurality of word lines for a single row of the plurality of rows so that a plurality of storage cells in the single row are addressed by a plurality of corresponding word lines, the state of the corresponding word lines being a function of the column address.

10. A storage according to claim 9, further comprising:

a cache controller coupled to the word lines and the bit lines, the cache controller selectively activating the word lines individually or in combination to effect a wrap-around effect between an upper cache line and a lower cache line, physically interleaving the upper cache line and the lower cache line.

11. A storage according to claim 1, further comprising:

a cache controller coupled to the word lines and the bit lines, the cache controller selectively applying operating power and denying operating power to selected storage cells of the plurality of storage cells depending on which cells are accessed.

12. A processor comprising:

an execution engine;

an instruction decoder coupled to the execution engine, the instruction decoder decoding instructions and supplying operations to the execution engine for execution;

a storage coupled to the instruction decoder, the storage supplying instructions to the instruction decoder for decoding into operations, the storage including:

a plurality of storage cells arranged in an array of rows and columns;

a plurality of bit lines coupling the array of storage cells into columns;

a plurality of word lines coupling the array of storage cells into rows, the plurality of word lines including multiple word lines for a single row of the plurality of rows so that multiple portions of the storage cells in the single row are addressed by corresponding multiple word lines wherein the word lines include:

a single polysilicon word line coupled to a row of storage cells, the single polysilicon word line being broken to separate the storage cells into a first segment and a second segment;

a pair of metal layer word lines including a first metal layer word line coupled to the polysilicon word line of the first storage cell segment and a second metal layer word line coupled to the polysilicon word line of the second storage cell segment.

13. A processor according to claim 12, wherein the plurality of storage cells are a plurality of static random access memory (SRAM) cells.

14. A processor according to claim 12, wherein the storage is a cache memory.

15. A processor according to claim 12, wherein the storage further includes:

a plurality of row decoders, individual row decoders being coupled to individual word lines of the plurality of word lines.

16. A processor according to claim 12, wherein the storage further includes:

a column multiplexer coupled to the corresponding multiple word lines of the single row of storage cells.

17. A processor according to claim 12, wherein the storage further includes:

a plurality of word lines coupling the array of storage cells into rows, the plurality of word lines including a pair of word lines for a single row of the plurality of rows so that two sections of the storage cells in the single row are addressed by two corresponding word lines.

18. A processor according to claim 17, further comprising:

a cache controller coupled to the word lines and the bit lines, the cache controller selectively activating the even word line and the odd word line individually or in combination to effect a wrap-around effect between an upper cache line and a lower cache line, physically interleaving the upper cache line and the lower cache line.

19. A processor according to claim 12, further comprising:

a cache controller coupled to the word lines and the bit lines, the cache controller selectively applying operating power and denying operating power to selected storage cells of the plurality of storage cells depending on which cells are accessed.

20. A method of accessing information in a storage comprising:

arranging a plurality of storage cells in an array of rows and columns, the storage cells being connected into columns by a plurality of bit lines and connected into rows by a plurality of word lines;

separating a single row of the plurality of rows into multiple portions of the storage cells;

connecting multiple word lines to corresponding multiple portions of the storage cells in the single row; and addressing the multiple portions of the storage cells in the single row by the corresponding multiple word lines; and selectively activating the even word line and the odd word line individually or in combination to effect a wrap-around effect between an upper cache line and a lower cache line, physically interleaving the upper cache line and the lower cache line.

21. A method according to claim 20, further comprising:

driving the multiple word lines using multiple corresponding row decoders.

22. A method according to claim 20, further comprising:

multiplexing the multiple word lines of the single row of storage cells.

23. A method according to claim 20, wherein:

the plurality of word lines include a pair of word lines for a single row of the plurality of rows so that two sections of the storage cells in the single row are addressed by two corresponding word lines, the two corresponding word lines being even and odd word lines.

24. A method according to claim 20, further comprising:

selectively applying operating power and denying operating power to selected storage cells of the plurality of storage cells depending on which cells are accessed.

25. A method according to claim 20, further comprising:

connecting a single polysilicon word line to a row of storage cells;

breaking the single polysilicon word line to separate the storage cells into a first segment and a second segment;

connecting a first metal layer word line to the polysilicon word line of the first storage cell segment; and connecting a second metal layer word line to the polysilicon word line of the second storage cell segment.

26. A storage comprising:

a plurality of storage cells arranged in an array of rows and columns;

a plurality of bit lines coupling the array of storage cells into columns;

a plurality of word lines crossing the array of storage cells into rows, the plurality of word lines including a plurality of word lines for a single row of the plurality of rows so that a plurality of storage cells in the single row are addressed by a plurality of corresponding word lines, the state of the corresponding word lines being a functions of the column address; and a storage controller coupled to the word lines and the bit lines, the storage controller selectively activating the word lines individually or in combination to effect a wrap-around effect between an upper cache line and a lower cache line, physically interleaving the upper cache line and the lower cache line.

27. A storage according to claim 26 wherein:

the storage is a cache memory; and the storage controller is a cache controller.

28. A storage comprising:

a plurality of storage cells arranged in an array of rows and columns;

a plurality of bit lines coupling the array of storage cells into columns;

a plurality of word lines crossing the array of storage cells into rows, the plurality of word lines including multiple word lines for a single row of the plurality of rows so that multiple portions of the storage cells in the single row are addressed by corresponding multiple unique word lines; and a storage controller coupled to the word lines and the bit lines, the storage controller selectively applying operating power and denying operating power to selected storage cells of the plurality of storage cells depending on which cells are accessed.

29. A storage according to claim 28 wherein:

the storage is a cache memory; and the storage controller is a cache controller.

30. A processor comprising:

an execution engine;

an instruction decoder coupled to the execution engine, the instruction decoder decoding instructions and supplying operations to the execution engine for execution;

a storage coupled to the instruction decoder, the storage supplying instructions to the instruction decoder for decoding into operations, the storage including:

a plurality of storage cells arranged in an array of rows and columns;

a plurality of bit lines coupling the array of storage cells into columns;

a plurality of word lines coupling the array of storage cells into rows, the plurality of word lines including a pair of word lines for a single row of the plurality of rows so that two sections of the storage cells in the single row are addressed by two corresponding word lines; and a cache controller coupled to the word lines and the bit lines, the cache controller selectively activating the even word line and the odd word line individually or in combination to effect a wrap-around effect between an upper cache line and a lower cache line, physically interleaving the upper cache line and the lower cache line.

31. A processor comprising:

an execution engine;

an instruction decoder coupled to the execution engine, the instruction decoder decoding instructions and supplying operations to the execution engine for execution;

a storage coupled to the instruction decoder, the storage supplying instructions to the instruction decoder for decoding into operations, the storage including:

a plurality of storage cells arranged in an array of rows and columns;

a plurality of bit lines coupling the array of storage cells into columns;

a plurality of word lines coupling the array of storage cells into rows, the plurality of word lines including multiple word lines for a single row of the plurality of rows so that multiple portions of the storage cells in the single row are addressed by corresponding multiple word lines; and a storage controller coupled to the word lines and the bit lines, the storage controller selectively applying operating power and denying operating power to selected storage cells of the plurality of storage cells depending on which cells are accessed.

32. A processor according to claim 31 wherein:

the storage is a cache memory; and the storage controller is a cache controller.

33. A method of accessing information in a storage comprising:

arranging a plurality of storage cells in an array of rows and columns, the storage cells being connected into columns by a plurality of bit lines and connected into rows by a plurality of word lines;

separating a single row of the plurality of rows into multiple portions of the storage cells;

connecting multiple word lines to corresponding multiple portions of the storage cells in the single row;

addressing the multiple portions of the storage cells in the single row by the corresponding multiple word lines;

connecting a single polysilicon word line to a row of storage cells;

breaking the single polysilicon word line to separate the storage cells into a first segment and a second segment;

connecting a first metal layer word line to the polysilicon word line of the first storage cell segment; and connecting a second metal layer word line to the polysilicon word line of the second storage cell segment.

* * * * *